United States Patent
Peng et al.

(10) Patent No.: US 7,349,234 B2
(45) Date of Patent: Mar. 25, 2008

(54) MAGNETIC MEMORY ARRAY

(75) Inventors: Yuan-Ching Peng, Hsinchu (TW); Shyue-Shyh Lin, Hsinchu (TW); Wei-Ming Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 296 days.

(21) Appl. No.: 11/119,052

(22) Filed: Apr. 29, 2005

(65) Prior Publication Data

US 2006/0120149 A1 Jun. 8, 2006

Related U.S. Application Data

(63) Continuation-in-part of application No. 10/904,897, filed on Dec. 3, 2004, now Pat. No. 7,173,841.

(51) Int. Cl.
*G11C 5/08* (2006.01)

(52) U.S. Cl. ............... 365/66; 365/63; 365/97; 365/158; 365/173; 365/171

(58) Field of Classification Search ............ 365/66, 365/63, 97, 158, 171, 173
See application file for complete search history.

(56) References Cited

U.S. PATENT DOCUMENTS

| | | | | |
|---|---|---|---|---|
| 4,841,480 A | * | 6/1989 | Lampe et al. ............... | 365/87 |
| 5,684,397 A | * | 11/1997 | Ishishita ..................... | 324/252 |
| 5,946,228 A | * | 8/1999 | Abraham et al. ............ | 365/173 |
| 6,215,301 B1 | * | 4/2001 | Lenssen ...................... | 324/252 |
| 6,335,890 B1 | | 1/2002 | Reohr et al. | |
| 6,424,561 B1 | * | 7/2002 | Li et al. ..................... | 365/158 |
| 6,500,706 B1 | | 12/2002 | Chi | |
| 6,522,574 B2 | * | 2/2003 | Li et al. ..................... | 365/158 |
| 6,590,803 B2 | * | 7/2003 | Saito et al. ................. | 365/158 |
| 6,605,837 B2 | * | 8/2003 | Schwarzl .................... | 257/296 |
| 6,670,646 B2 | | 12/2003 | Lu et al. | |
| 6,768,150 B1 | | 7/2004 | Low et al. | |
| 6,879,505 B2 | * | 4/2005 | Scheuerlein ................. | 365/51 |
| 6,885,576 B2 | * | 4/2005 | Deak .......................... | 365/158 |
| 6,891,193 B1 | * | 5/2005 | Schwarz ...................... | 257/53 |
| 6,922,921 B2 | * | 8/2005 | Sakai et al. .................. | 37/257 |
| 7,046,546 B1 | * | 5/2006 | Inaba .......................... | 365/158 |
| 7,057,222 B2 | * | 6/2006 | Jeong ......................... | 257/295 |
| 7,173,841 B2 | * | 2/2007 | Peng et al. .................. | 365/66 |
| 7,193,286 B2 | * | 3/2007 | Anderson et al. ........... | 257/421 |

* cited by examiner

*Primary Examiner*—Viet Q. Nguyen
(74) *Attorney, Agent, or Firm*—Baker & McKenzie LLP

(57) ABSTRACT

A magnetic random access memory (MRAM) device disclosed herein includes an array of magnetic memory cells having magnetoresistive (MR) stacks. The MRAM array also includes a series of bit lines and word lines coupled to the MR stacks. The array layout provides for reduced crosstalk between neighboring memory cells by increasing a distance between neighboring MR stacks along a common conductor without increasing the overall layout area of the MRAM array. Several embodiments are disclosed where neighboring MR stacks are offset such that the MR stacks are staggered. For example, groups of MR stacks coupled to a common word line or to a common bit line can be staggered. The staggered layout provides for increased distance between neighboring MR stacks for a given MRAM array area, thereby resulting in a reduction of crosstalk, for example during write operations.

20 Claims, 9 Drawing Sheets

MAGNETIC MEMORY ARRAY

CROSS-REFERENCE TO RELATED APPLICATIONS

This application is a continuation-in-part of U.S. application Ser. No. 10/904,897, filed Dec. 3, 2004, entitled "Magnetic Memory Array," now U.S. Pat. No. 7,173,841 the entire contents of which is hereby incorporated by reference.

TECHNICAL FIELD

The present invention relates generally to semiconductor devices, and more particularly to a magnetic random access memory (MRAM) device.

BACKGROUND

Magnetic random access memory (MRAM) is a non-volatile memory that uses magnetism rather than electrical power to store data. FIG. 1 shows a schematic diagram of a portion 10 of an MRAM array, which includes a plurality of memory cells 12-19. Each memory cell 12-19 includes a magnetoresistive (MR) stack 20-27 and a transistor 30-37. The transistors 30-33 are coupled to each other via a word line (WL1) 40, and transistors 34-37 are coupled to each other via a word line (WL2) 41, where the word lines 40, 41 form the gate electrode for the transistors 30-37. The transistors 30-33 are also coupled to each other via a program line (PL1) 42, and transistors 34-37 are coupled via a program line (PL2) 43, where the program lines 42, 43 serve as virtual ground lines. Similarly, the MR stacks 20 and 24 are coupled to each other by bit line (BL1) 45, MR stacks 21 and 25 are coupled to each other by bit line (BL2) 46, MR stacks 22 and 26 are coupled to each other by bit line (BL3) 47, and MR stacks 23 and 27 are coupled to each other by bit line (BL4) 48. The bit lines 45-48 are typically somewhat perpendicular to the word lines 40, 41 and the program lines 42, 43.

Each of the MR stacks 20-27 is a multi-layer magnetoresistive structure, such as a magnetic tunneling junction (MTJ) or a giant magnetoresistive (GMR) structure. FIG. 2 shows an example of a typical MTJ structure 50. The MTJ structure 50 includes four basic layers: a free layer 52, a spacer 54 which serves as a tunneling barrier, a pinned layer 56, and a pinning layer 58. The free layer 52 and the pinned layer 56 are constructed of ferromagnetic material, for example cobalt-iron or nickel-cobalt-iron. The pinning layer 58 is constructed of antiferromagnetic material, for example platinum manganese. Magnetostatic coupling between the pinned layer 56 and the pinning layer 58 causes the pinned layer 56 to have a fixed magnetic moment. The free layer 52, on the other hand, has a magnetic moment that, by application of a magnetic field, can be switched between a first orientation, which is parallel to the magnetic moment of the pinned layer 56, and a second orientation, which is antiparallel to the magnetic moment of the pinned layer 56.

The spacer 54 interposes the pinned layer 56 and the free layer 52. The spacer 54 is composed of insulating material, for example aluminum oxide, magnesium oxide, or tantalum oxide. The spacer 54 is formed thin enough to allow the transfer (tunneling) of spin-aligned electrons when the magnetic moments of the free layer 52 and the pinned layer 56 are parallel. On the other hand, when the magnetic moments of the free layer 52 and the pinned layer 56 are antiparallel, the probability of electrons tunneling through the spacer 54 is reduced. This phenomenon is commonly referred to as spin-dependent tunneling (SDT).

As shown in FIG. 3, the electrical resistance through the MTJ 50 (e.g., through layers 52-58) increases as the moments of the pinned and free layers become more anti-parallel and decreases as they become more parallel. In an MRAM memory cell, the electrical resistance of the MTJ 50 can therefore be switched between first and second resistance values representing first and second logic states. For example, a high resistance value can represent a logic state "1" and a low resistance value can represent a logic state "0". The logic states thus stored in the memory cells can be read by passing a sense current through the MR stack and sensing the resistance. For example, referring back to FIG. 1, the logic state of memory cell 12 can be read by passing a sense current through bit line (BL1) 45, activating transistor 30 via word line (WL1) 40, and sensing the current passing to program line (PL1) 42.

FIG. 4 shows a layout of the portion 10 of the MRAM array, where MR stacks 20-27 and word lines 40, 41 are shown in broken lines, and transistors 30-37 are omitted for the sake of clarity. During a write operation, electrical current flows through a program line 42, 43 and a bit line 45-48 that intersect at the target memory cell 12-19. For example, in order to write to memory cell 13, a current is passed through program line (PL1) 42 and a current is passed through bit line (BL2) 46. The magnitude of these currents is selected such that, ideally, the resulting magnetic fields are not strong enough on their own to affect the memory state of the MR stacks 20-23 and 25, but the combination of the two magnetic fields (at MR stack 21) is sufficient for switching the memory state (e.g., switching the magnetic moment of the free layer 52) of the MR stack 21.

However, in practice, the states of neighboring MR stacks 20, 22, and 25 can be affected by the magnetic field at the intersection of bit line (BL2) 46 and program line (PL1) 42, resulting in an unstable memory device. In order to avoid this problem, the memory array 10 is designed such that neighboring cells are separated by distance R. The distance R is selected such that neighboring memory cells are positioned outside the influence of intersecting magnetic fields. Typically, the magnitude of a magnetic field felt by a neighboring MR stack is inversely proportional to the square of the distance R between the neighboring MR stacks. As a consequence, memory cell density (i.e., number of memory cells per unit area) is limited due to the distance requirements necessary to ensure a stable memory device.

SUMMARY

Disclosed herein is an improved magnetic random access memory (MRAM) device. According to concepts discussed below, an MRAM device can be produced that is more reliable than prior MRAM devices. The improvement in reliability can be realized by producing an MRAM device wherein the memory array layout provides for reduced crosstalk between neighboring memory cells. For example, in some embodiments the MRAM device includes an array of magnetoresistive (MR) stacks. Among the array of MR stacks, groups of the MR stacks are coupled by common conductors (e.g., word lines and bit lines). A distance between neighboring MR stacks along a common conductor is increased compared to prior layouts without increasing the overall layout area of the MRAM array, thereby reducing the magnitude of a magnetic field (e.g., used for writing to an MR stack) that reaches a neighboring MR stack. By reducing the magnitude of the magnetic field that reaches neighboring MR stacks, crosstalk can be better avoided.

In order to increase the distance between neighboring MR stacks without increasing the overall area of an MRAM array, the MR stacks can be staggered such that, instead of being arranged in a straight line, neighboring MR stacks are offset in some way. For example, in some embodiments the MR stacks are staggered in a word-line direction or in a bit line direction. That is, for a group of MR stacks coupled by a common conductor, a first portion of the group lies along a first axis and a second portion of the group lies along a second axis, where the first and second axes are parallel and offset by a non-zero distance in a direction orthogonal to both the first and second axes, and where adjacent MR stacks of the group belong to different ones of the first and second portions. In other embodiments, the group can include a third portion that lies along a third axis parallel to the first and second axis and offset from both of the first and second axes by non-zero distances.

BRIEF DESCRIPTION OF THE DRAWINGS

Embodiments are illustrated by way of example in the accompanying figures, in which like reference numbers indicate similar parts, and in which.

DETAILED DESCRIPTION

Figure 5:
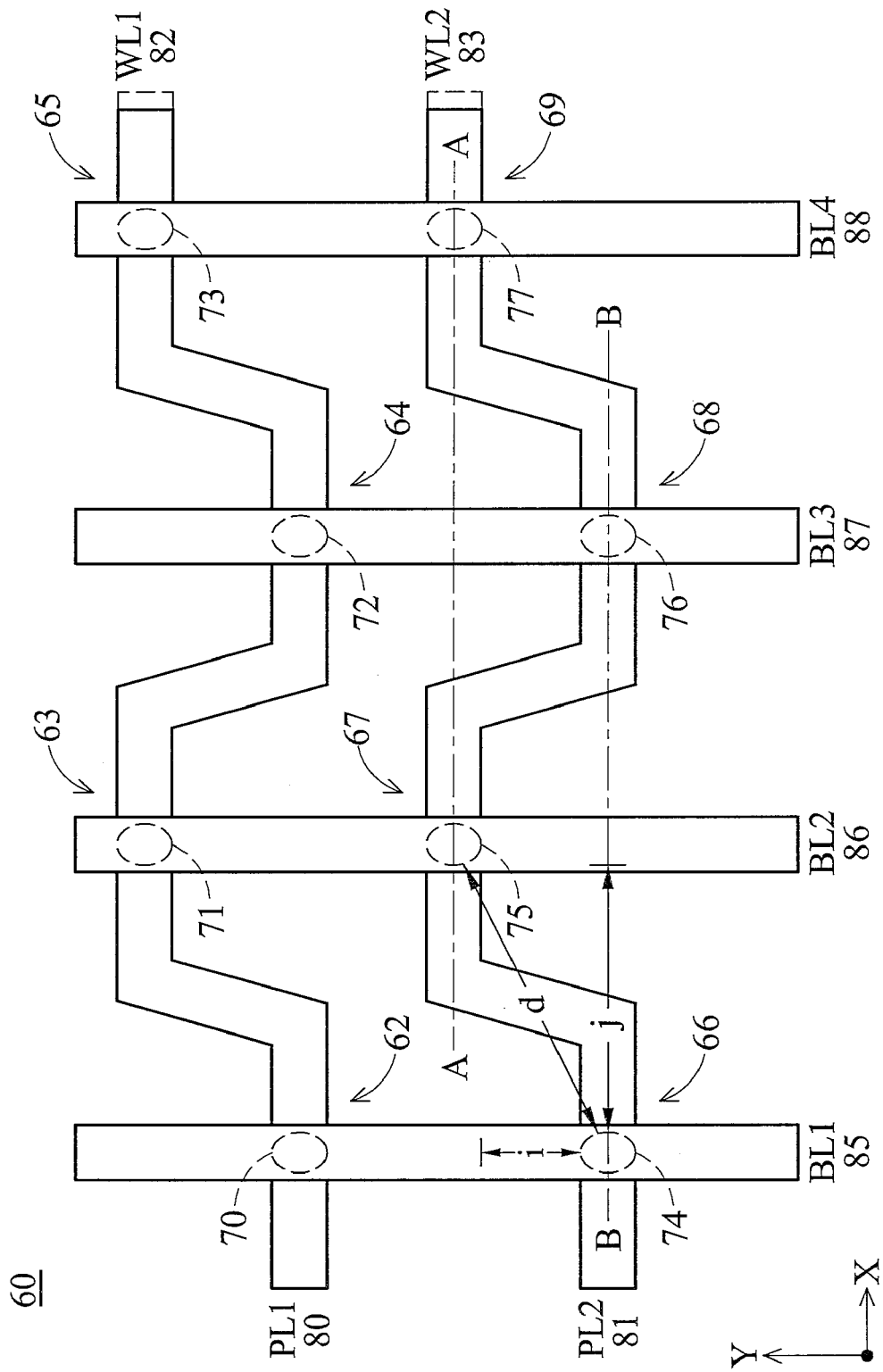
FIG. 5 shows a schematic diagram of a staggered layout of a portion of an MRAM array.

FIG. 5 shows a layout of a portion 60 of an MRAM array. The portion 60 of the MRAM array includes eight memory cells 62-69. Of course, it will be appreciated that an actual MRAM array comprises significantly more memory cells, but eight are shown for purposes of discussion. The portion 60 also includes a plurality of program lines 80, 81, a plurality of word lines 82, 83, and a plurality of bit lines 85-88. The word lines 82, 83 extend below the program lines 80, 81, respectively. The program lines, word lines, and bit lines 80-88 are conductive lines, for example constructed of copper, aluminum, alloys or combinations thereof.

Figure 1:
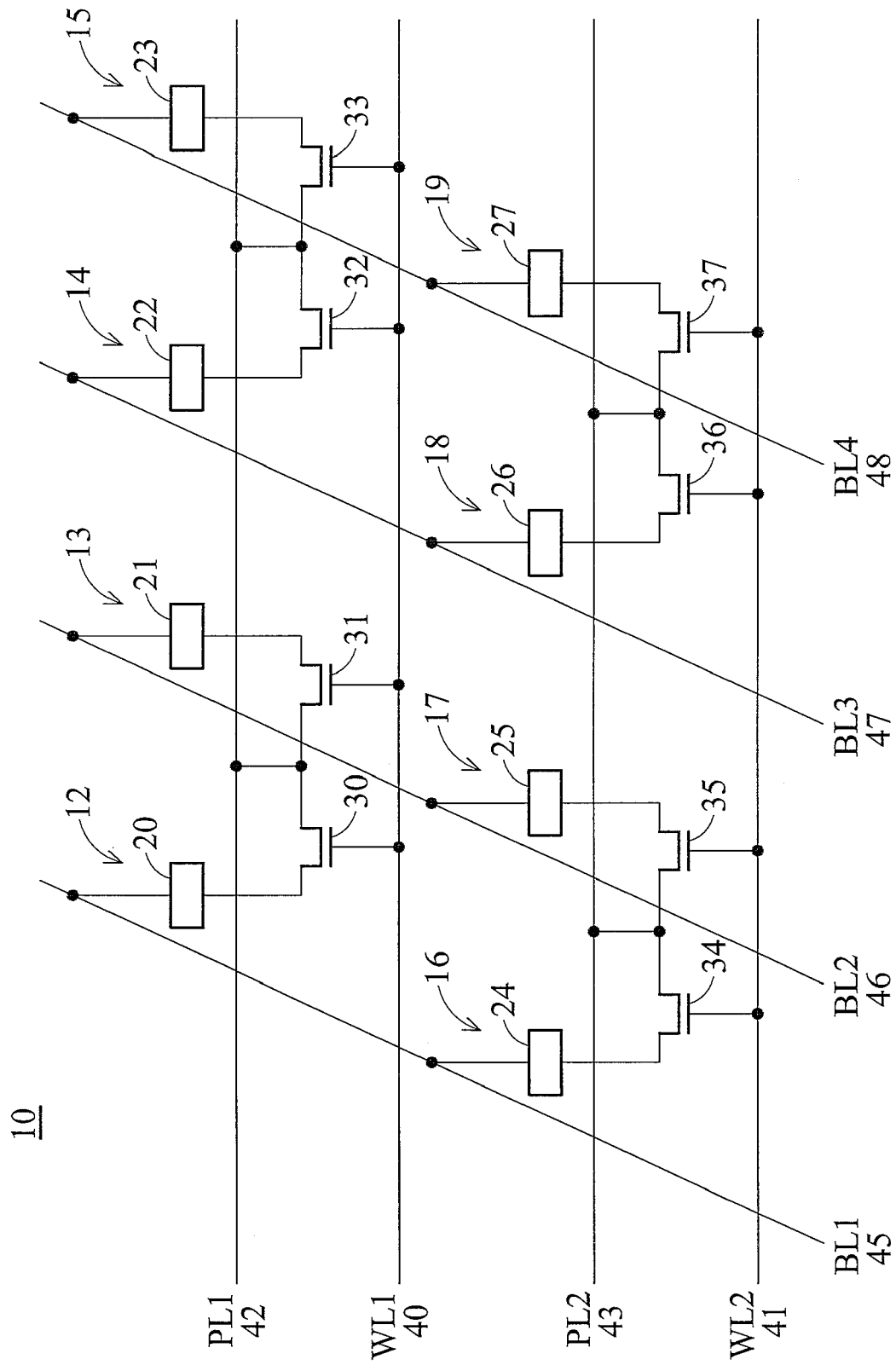
FIG. 1 shows a schematic diagram of a portion of an MRAM array.

Each memory cell 62-69 includes a respective magnetoresistive (MR) stack 70-77 positioned at an intersection of a program line 80, 81/word line 82, 83 and a bit line 85-88. Specifically, in a column direction (parallel to the y-axis): (1) the MR stacks 70 and 74 are coupled to each other by bit line (BL1) 85; (2) MR stacks 71 and 75 are coupled to each other by bit line (BL2) 86; (3) MR stacks 72 and 76 are coupled to each other by bit line (BL3) 87; and (4) MR stacks 73 and 77 are coupled to each other by bit line (BL4) 88. In a row direction (parallel to the x-axis) MR stacks 70-73 are staggered and coupled to each other by word line (WL1) 82, and MR stacks 74-77 are staggered and coupled to each other by word line (WL2) 83. It will be appreciated that the MR stacks 70-77 can be coupled to the word lines 82, 83 via transistors (not shown), for example as shown in FIG. 1.

Figure 2:
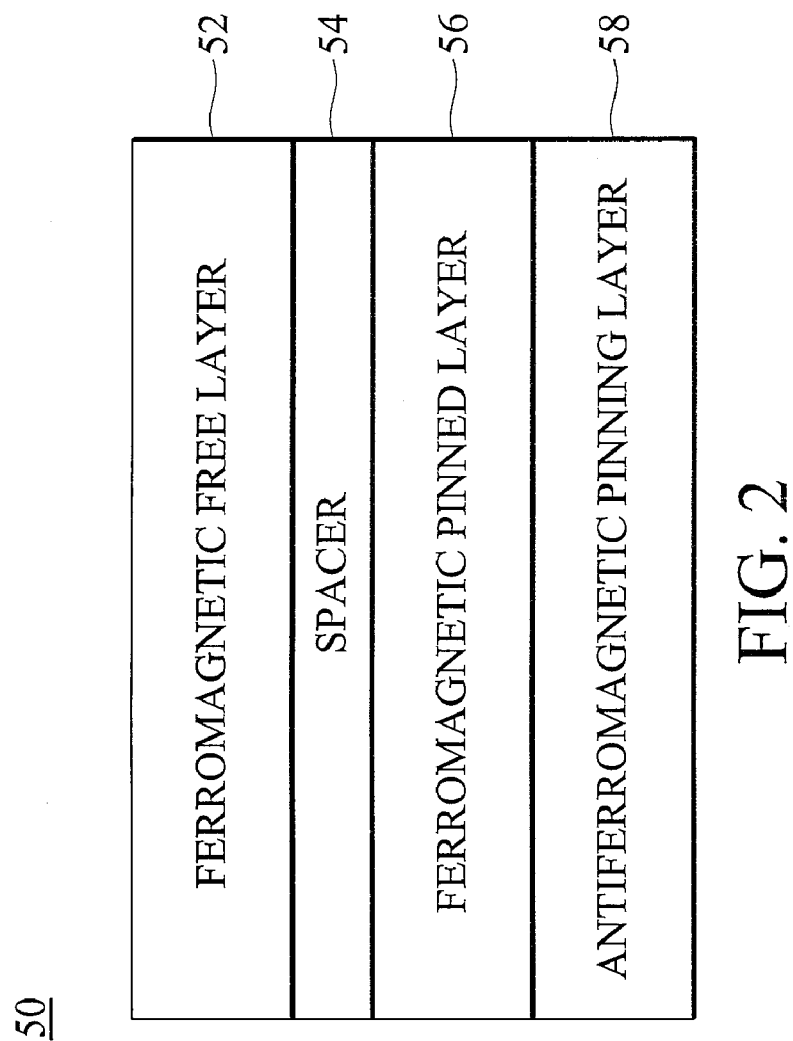
FIG. 2 shows a schematic block diagram of a typical MTJ structure.
Figure 3:
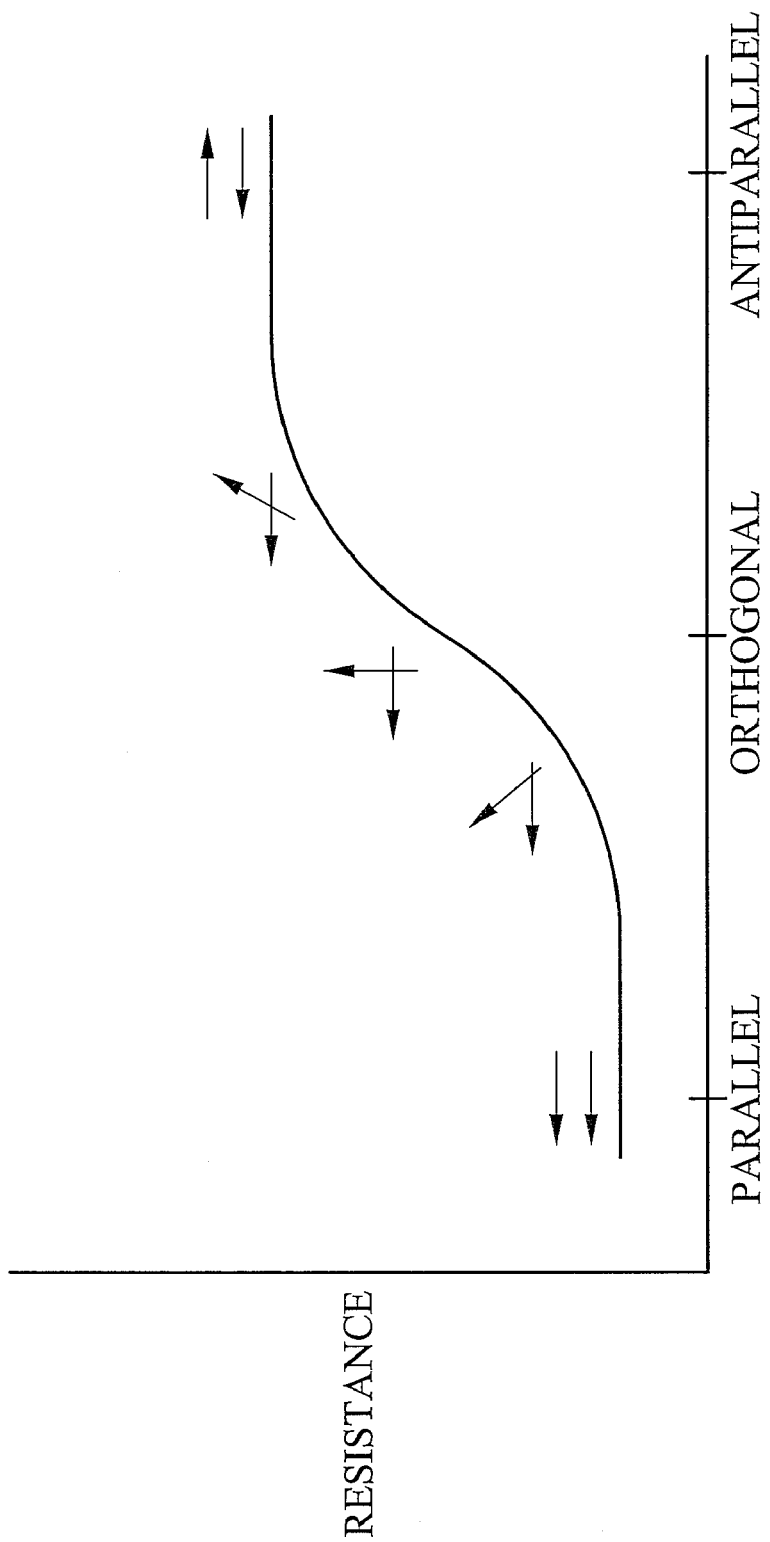
FIG. 3 shows a graph of the relationship between resistance and the relative magnetic orientations of the free and pinned layers in the MTJ shown in FIG. 2.

In the embodiment shown in FIG. 5, the MR stacks 70-77 are elliptical in shape. In alternate embodiments, the MR stacks 70-77 can have other shapes (e.g., rectangular, oval, or square). In a preferred embodiment, the MR stacks 70-77 each comprise an MTJ structure 50 as shown in FIG. 2. In alternate embodiments, the MR stacks 70-77 can comprise other types of magnetoresistive structures, for example a GMR structure.

It will be appreciated by those skilled in the art that the MRAM array 60 includes support circuitry (not shown for the sake of clarity), such as decoders and sense amplifiers to facilitate memory access (e.g., reads and writes). In addition, it will be appreciated that each memory cell 62-69 can also include additional circuitry (not shown for the sake of clarity). For example, similar to the memory cells 12-19 shown in FIG. 1, each memory cell 62-69 can include a transistor (not shown) for read operations connected between a respective MR stack 70-77, a word line 90, 91, and a program line 80, 81 (e.g., for each transistor, the gate is connected to a respective word line 90, 91, the drain is connected to a respective MR stack 70-77, and the source is connected to a respective program line 80, 81).

The MR stacks 70-77 are arranged in columns (along the bit lines 85-88) and in staggered rows (along the program lines 80, 81). The MR stacks 70-77 are aligned with MR stacks adjacent in the column direction (i.e., parallel to the y-axis). Specifically, MR stacks 70 and 74 are aligned, MR stacks 71 and 75 are aligned, MR stacks 72 and 76 are aligned, and MR stacks 73 and 77 are aligned. The MR stacks 70-77 are staggered in the row direction (i.e., parallel to the x-axis) such that MR stacks adjacent in the row direction are separated by a distance in the column direction. As a result, the MR stacks 70-77 are arranged in a checkerboard pattern rather than in rows and columns. For example, MR stack 74 is aligned with MR stack 70 in a first direction (i.e., parallel to the y-axis), and MR stack 74 is aligned with MR stack 75 in a second direction (i.e., parallel to dimension arrows shown for distance d), where the first and second directions are non-orthogonal. Specifically, in the embodiment shown in FIG. 5 the first and second directions are angularly offset by an angle of approximately 45 degrees. The staggered arrangement of the memory cells 62-69 allows for increased distance between adjacent cells (e.g., for reducing crosstalk) without reducing memory cell density or increasing the MRAM array area.

Stated another way, in the embodiment shown the MR stacks 74 and 76 are aligned along a first axis A-A (parallel to the x-axis) and MR stacks 75 and 77 are aligned along a second axis B-B (parallel to the x-axis), where the first and second axes are parallel and separated by a non-zero distance.

As shown in FIG. 5, MR stacks that are adjacent in the row direction, for example MR stacks 74 and 75, are separated by a distanced in the row direction and staggered such that they are separated by a distance i in the column direction. In order to maximize crosstalk reduction, the distance i is preferably half the distanced (i.e., i=j/2).

Crosstalk is then reduced compared to prior arrangements, such as that shown in FIG. 4, as follows. If the distanced between adjacent memory cells 74 and 75 in the row direction (x-axis in FIG. 5) is equal to the distance R between adjacent memory cells 24 and 25, then the memory cells 74 and 75 are separated by a distance d that is greater than the distance R between memory cells 24 and 25 as follows:

$$d=\sqrt{i^2+j^2}=\sqrt{(j/2)^2+j^2}=\sqrt{(R/2)^2+R^2}=\sqrt{5}\ R/2=1.12R$$

During a write operation, a magnetic field of magnitude B is present at MR stack 74. The magnitude of this magnetic field present at adjacent MR stack 75 is inversely proportional to the square of the distance d between the neighboring MR stacks 74 and 75. This increase in distance results in a decrease in the amount of the magnetic field B present at the adjacent MR stack 75 as follows:

$$B=1/d^2=1/(1.12R)^2=0.8(1/R^2)$$

Figure 4:
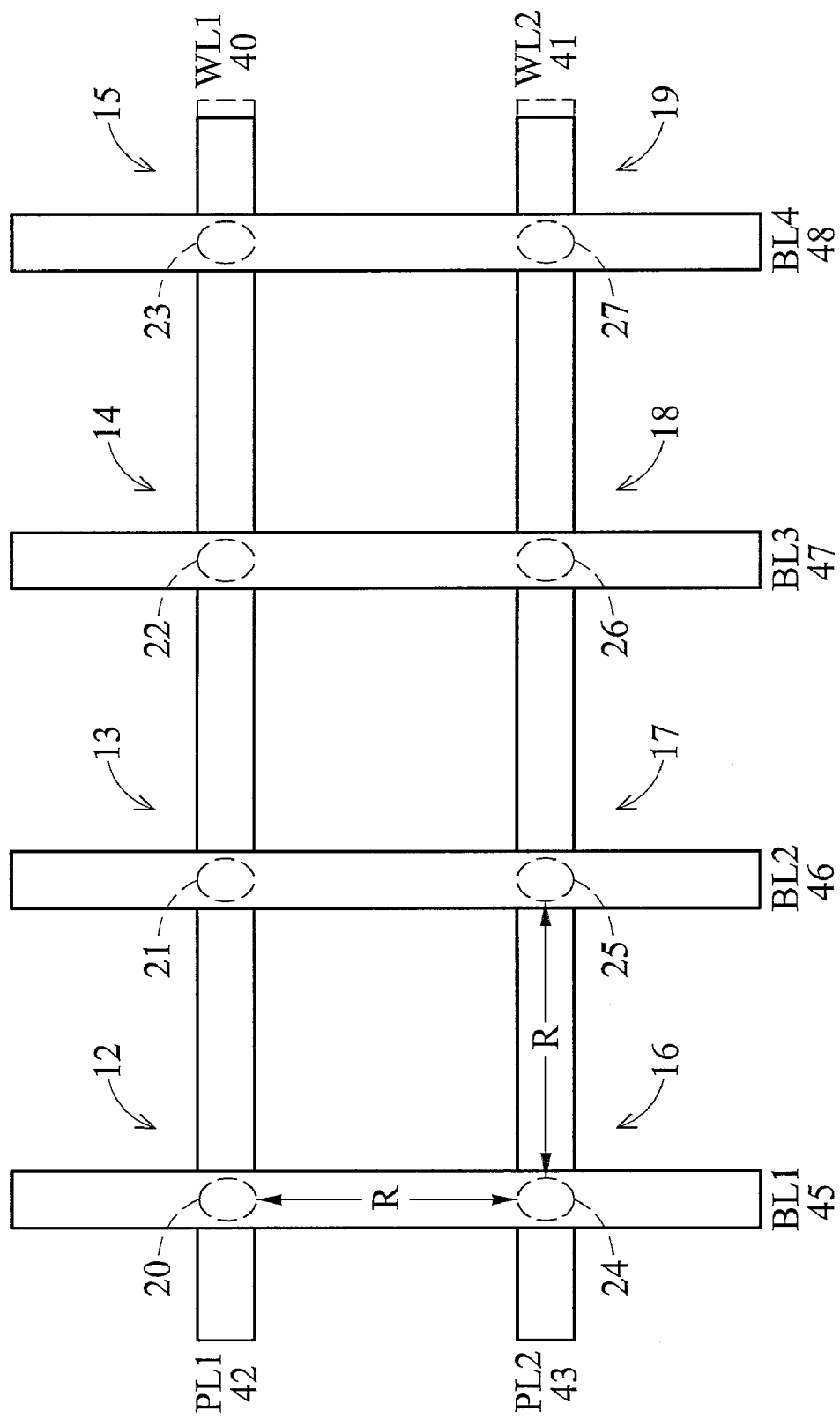
FIG. 4 shows a schematic diagram of a layout of the portion of the MRAM array shown in FIG. 1.

Thus, the staggered cell arrangement of the present embodiment provides for a reduction by approximately 20% in the magnitude of the magnetic field B present at MR stack 75 compared to the prior arrangement shown in FIG. 4. While it is thus preferable for i=j/2, other values for the distance i can be used.

Figure 6:
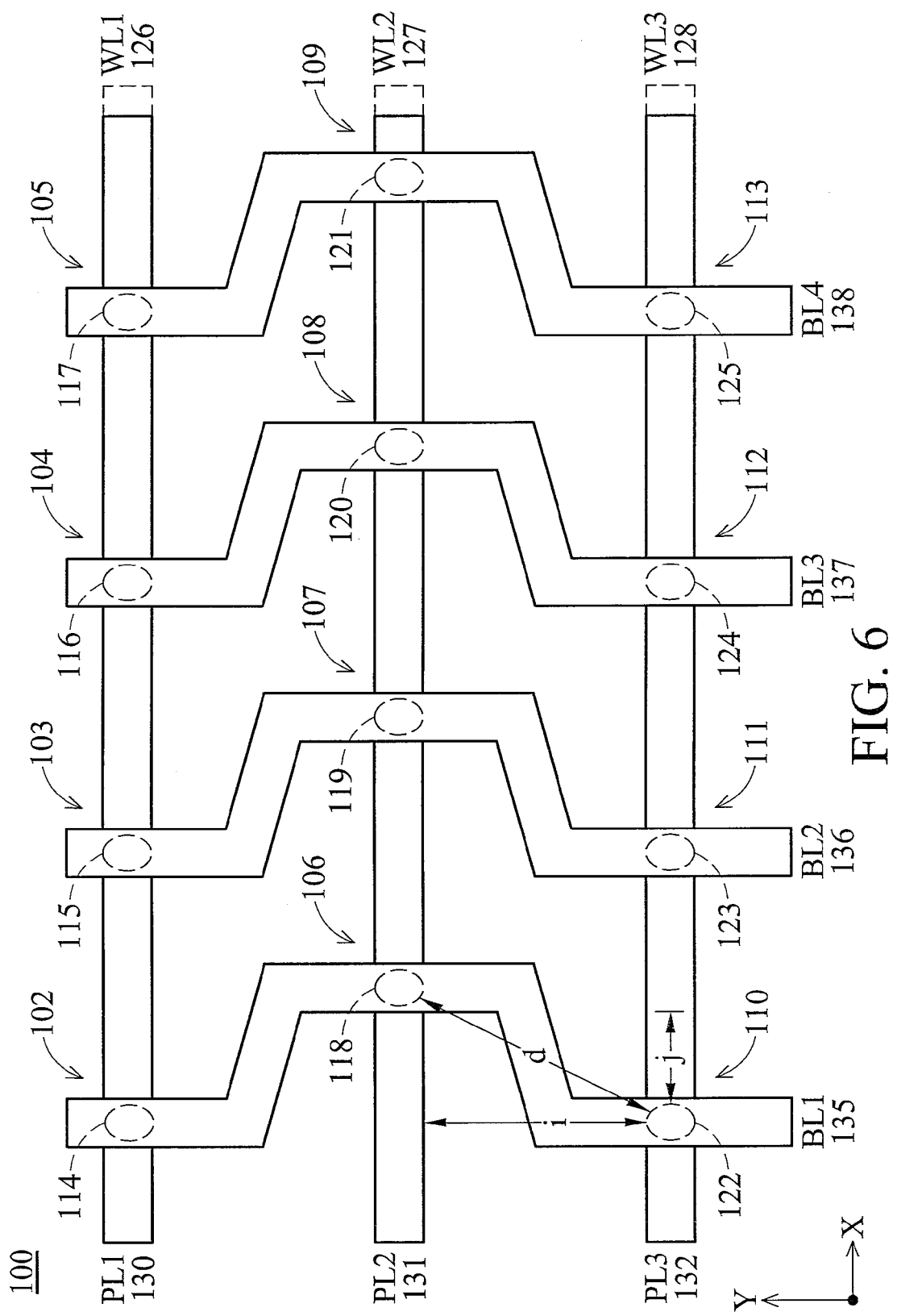
FIG. 6 shows a schematic diagram of a second staggered layout of a portion of an MRAM array.

FIG. 6 shows a layout of a portion 100 of an MRAM array, illustrating an alternate embodiment. The portion 100 of the MRAM array includes twelve memory cells 102-113. Again, it will be appreciated that an actual MRAM array comprises significantly more memory cells, but twelve are shown for purposes of discussion. The portion 100 also includes a plurality of program lines 130-132, a plurality of word lines 126-128, and a plurality of bit lines 135-138. The word lines 126-128 extend below the program lines 130-132, respectively. The program lines 130-132, word lines 126-128, and bit lines 135-138 are conductive lines, for example constructed of copper, aluminum, alloys or combinations thereof.

Each memory cell 102-113 includes a respective magnetoresistive (MR) stack 114-125 positioned at an intersection of a program line 130-132/word line 126-128 and a bit line 135-138. Specifically, in a column direction (parallel to the y-axis): (1) the MR stacks 114, 118, and 122 are staggered and coupled to each other by bit line (BL1) 135; (2) MR stacks 115, 119, and 123 are staggered and coupled to each other by bit line (BL2) 136; (3) MR stacks 116, 120, and 124 are staggered and coupled to each other by bit line (BL3) 137; and (4) MR stacks 117, 121, and 125 are staggered and coupled to each other by bit line (BL4) 138. In a row direction (parallel to the x-axis): (1) MR stacks 114-117 are coupled to each other by word line (WL1) 126; (2) MR stacks 118-121 are coupled to each other by word line (WL2) 127; and (3) MR stacks 122-125 are coupled to each other by word line (WL3) 128. It will be appreciated that the MR stacks 114-125 can be coupled to word lines 126-128 via transistors (not shown), for example as shown in FIG. 1.

The discussion above in connection with the embodiment shown in FIG. 5 applies equally to FIG. 6, except that in FIG. 6 the MR stacks are staggered in the column direction rather than in the row direction as in FIG. 5. Therefore, additional details of the portion 100 of the MRAM array are not repeated. It is worth noting, however, that in the embodiment shown in FIG. 6 it is preferable for the distance j to be equal to half the distance i (i.e., j=i/2) in order to maximize the reduction in crosstalk resulting from the staggered MR stack arrangement. However, other values for the distance j can be used.

Figure 7:
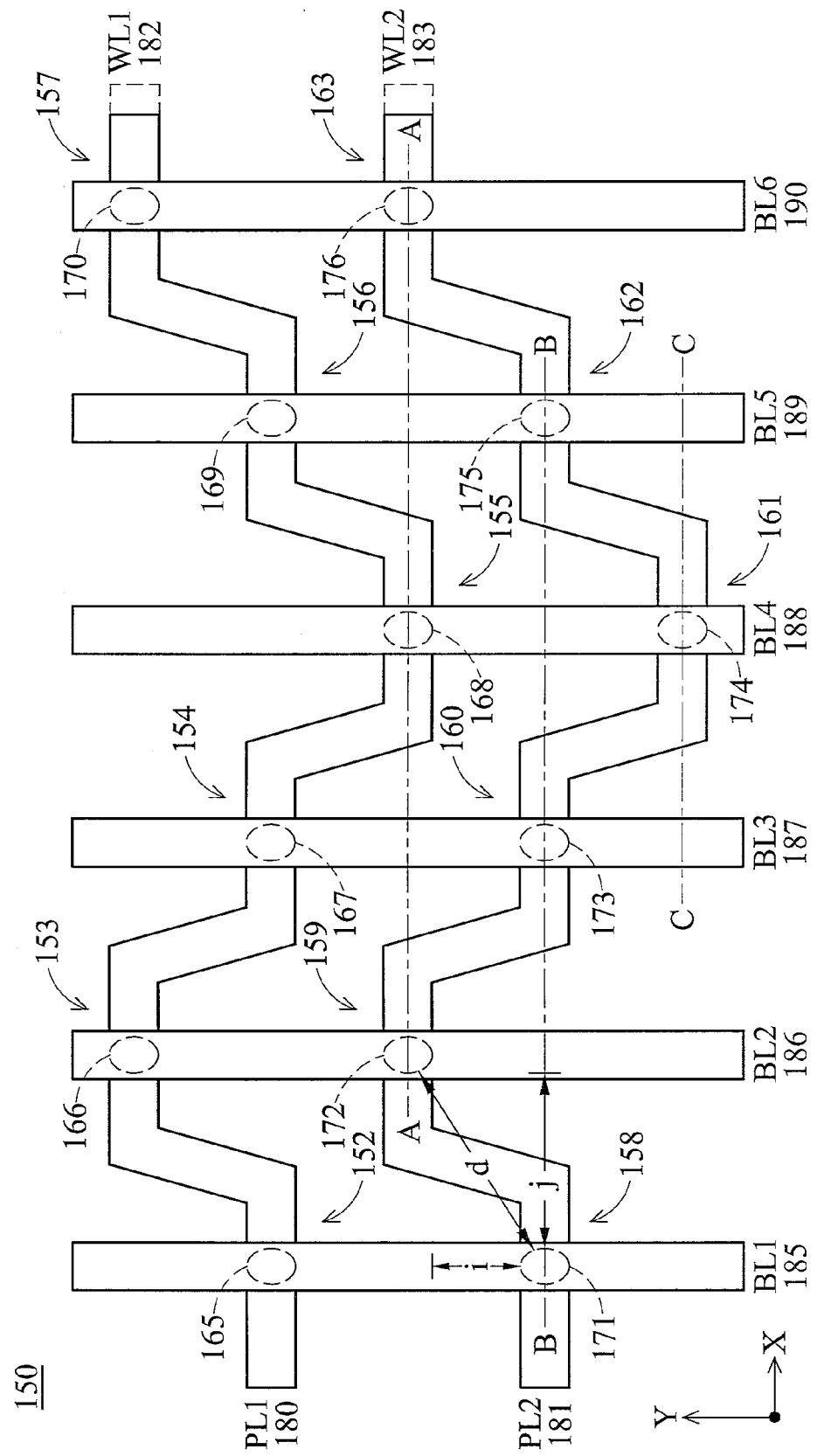
FIG. 7 shows a schematic diagram of a third staggered layout of a portion of an MRAM array.

FIG. 7 shows a layout of a portion 150 of an MRAM array, illustrating another alternate embodiment. The portion 150 of the MRAM array includes twelve memory cells 152-163. Again, it will be appreciated that an actual MRAM array comprises significantly more memory cells, but twelve are shown for purposes of discussion. The portion 150 also includes a plurality of program lines 180, 181, a plurality of word lines 182, 183, and a plurality of bit lines 185-190. The word lines 182, 183 extend below the program lines 180, 181, respectively. The program lines 180, 181, word lines 182, 183, and bit lines 185-190 are conductive lines, for example constructed of copper, aluminum, alloys or combinations thereof.

Each memory cell 152-163 includes a respective magnetoresistive (MR) stack 165-176 positioned at an intersection of a program line 180, 181/word line 182, 183 and a bit line 185-190. Specifically, in a column direction (parallel to the y-axis): (1) the MR stacks 165, 171 are coupled to each other by bit line (BL1) 185; (2) MR stacks 166, 172 are coupled to each other by bit line (BL2) 186; (3) MR stacks 167, 173 are coupled to each other by bit line (BL3) 187; (4) MR stacks 168, 174 are coupled to each other by bit line (BL4) 188; (5) MR stacks 169, 175 are coupled to each other by bit line (BL5) 189; and (6) MR stacks 170, 176 are coupled to each other by bit line (BL6) 190. In a row direction (parallel to the x-axis) MR stacks 165-170 are staggered and coupled to each other by word line (WL1) 182, and MR stacks 171-176 are staggered and coupled to each other by word line (WL2) 183. It will be appreciated that the MR stacks 165-176 can be coupled to the word lines 182, 183 via transistors (not shown), for example in an arrangement such as that shown in FIG. 1.

The discussion above in connection with the embodiment shown in FIG. 5 applies equally to FIG. 7, except that in FIG. 7 the MR stacks are staggered in the row direction in such a way that the direction in which the MR stacks is staggered alternates. In other words, the MR stacks 172 and 176 lie along a first axis A-A, MR stacks 171, 173, and 175 lie along a second axis B-B, and MR stack 174 lies on a third axis C-C, where the first, second, and third axes are parallel and separated by a non-zero distances.

Figure 8:
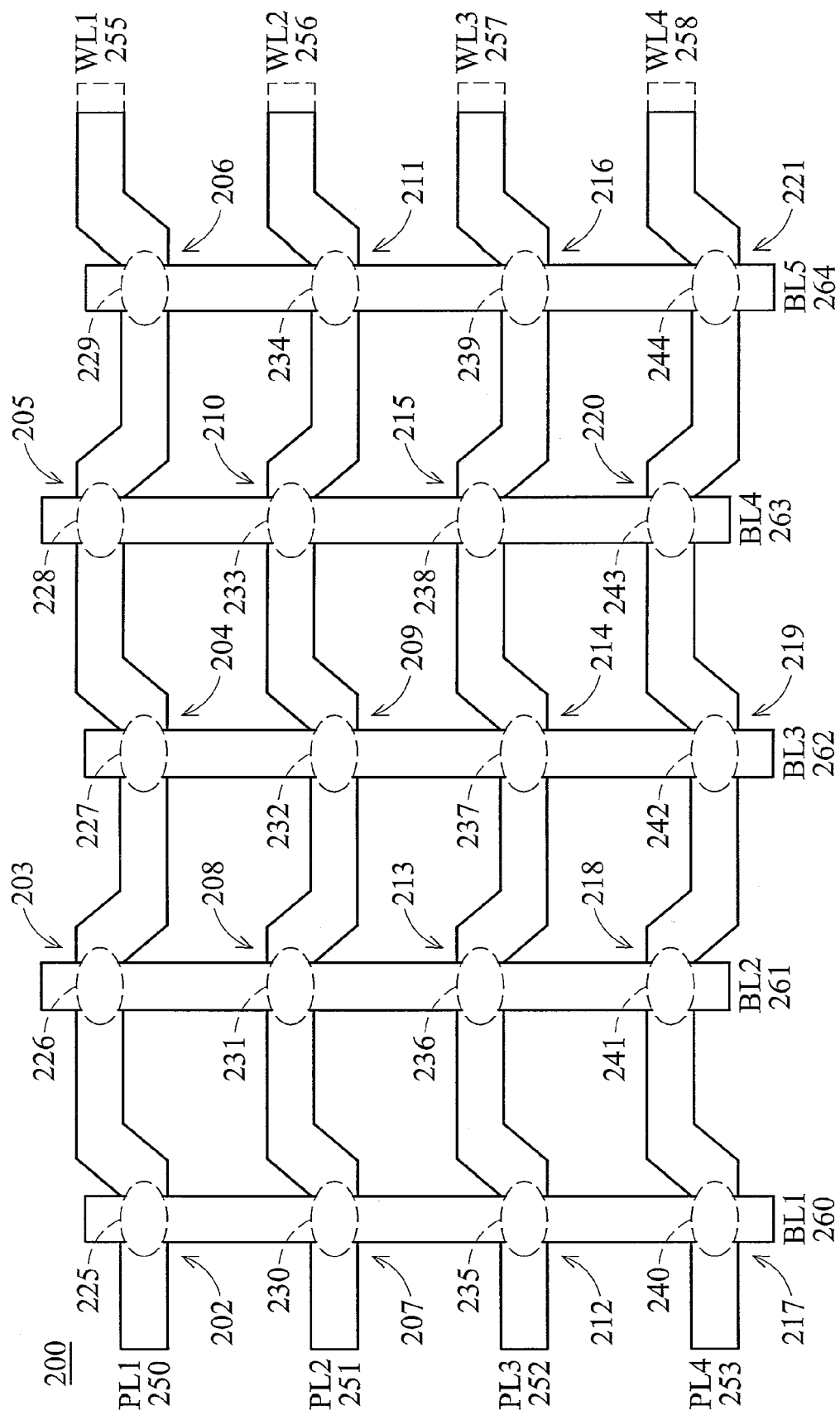
FIG. 8 shows a schematic diagram of an alternate layout of a portion of an MRAM array.

FIG. 8 shows a layout of a portion 200 of an MRAM array, illustrating another alternate embodiment. The portion 200 of the MRAM array includes twenty memory cells 202-221. Again, it will be appreciated that an actual MRAM array comprises significantly more memory cells, but twenty are shown for purposes of discussion. The portion 200 also includes a plurality of program lines 250-253, a plurality of word lines 255-258, and a plurality of bit lines 260-264. The word lines 260-264 extend below the program lines 250-253, respectively. The program lines 250-253, word lines 255-258, and bit lines 260-264 are conductive lines, for example constructed of copper, aluminum, alloys or combinations thereof.

Each memory cell 202-221 includes a respective magnetoresistive (MR) stack 225-244 positioned at an intersection of a program line 250-253/word line 255-258 and a bit line 260-264. Specifically, in a column direction (parallel to the y-axis): (1) the MR stacks 225, 230, 235, and 240 are coupled to each other by bit line (BL1) 260; (2) MR stacks 226, 231, 236, and 241 are coupled to each other by bit line (BL2) 261; (3) MR stacks 227, 232, 237, and 242 are coupled to each other by bit line (BL3) 262; (4) MR stacks 228, 233, 238, and 243 are coupled to each other by bit line (BL4) 263; and (5) MR stacks 229, 234, 239, and 244 are coupled to each other by bit line (BL5) 264. In a row direction (parallel to the x-axis): (1) MR stacks 225-229 are staggered and coupled to each other by word line (WL1) 255; (2) MR stacks 230-234 are staggered and coupled to each other by word line (WL2) 256; (3) MR stacks 235-239 are staggered and coupled to each other by word line (WL3) 257; and (4) MR stacks 240-244 are staggered and coupled to each other by word line (WL4) 258. It will be appreciated that the MR stacks 225-244 can be coupled to the word lines 255-258 via transistors (not shown), for example in an arrangement such as that shown in FIG. 1.

Figure 9:
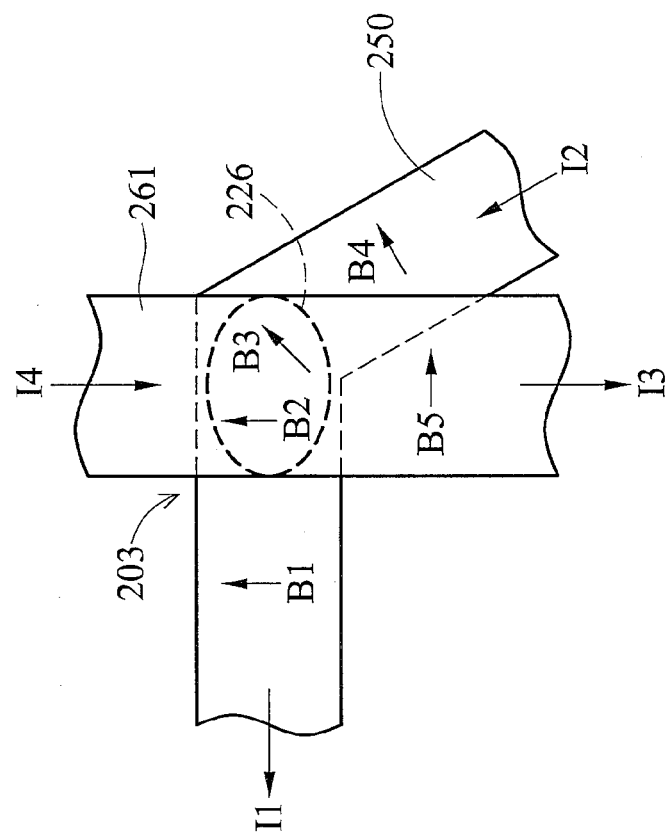
FIG. 9 shows an enlarged view of a portion of the MRAM array shown in FIG. 8.

The discussion above in connection with the embodiment shown in FIG. 5 applies equally to FIG. 8, except that in FIG. 8 the MR stacks are positioned at or near inflections in the write lines (and program lines). For example, FIG. 9 shows an enlarged view of the memory cell 203, which includes the MR stack 226. At least a portion of the MR stack 226 is positioned between the conductive line 261 and an inflected region (e.g., region where the conductive line 261 turns or otherwise extends in a non-linear manner) of the conductive line 250. The arrows B1-B4 are generally indicative of moments of the magnetic field above the conductive line 250 when an electrical current passes through the conductive line 250 in the direction generally indicated by the arrows I1 and I2. The arrow B5 is generally indicative of the moment of the magnetic field below the conductive line 261 when an electrical current passes through the conductive line 261 in the direction generally indicated by the arrows I3 and I4. The thing to note here is that, because of the inflection in the conductive line 250, the moment of the electrical current and, thus, the resulting magnetic field, changes in a similar fashion. The magnetic moment of the field emanating from the conductive line 250 is therefore angularly offset from the hard axis of the MR stack 226. This angular offset can help the MR stack 226 switch its magnetic direction, which will be explained in conjunction with FIG. 10.

Figure 10:
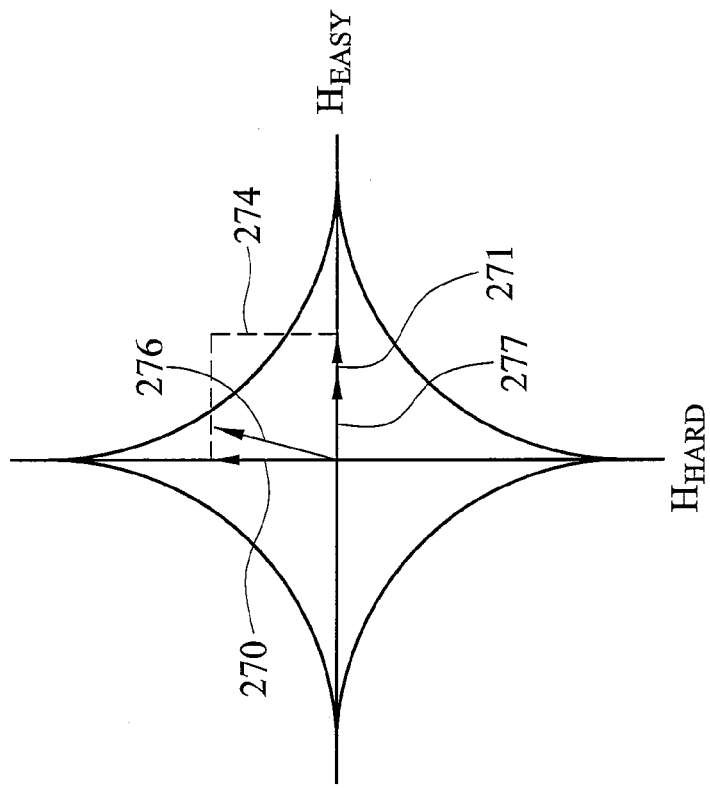
FIG. 10 shows a graph of magnetic moments of the MRAM array shown in FIG. 8 are plotted on an asteroid curve.

FIG. 10 shows a standard asteroid curve based on the Stoner-Wohlfarth coherent rotation model. For the MR stack 226 to switch its magnetic direction, the net magnetic moment of the magnetic fields emanating from the conductive lines 250 and 260 should lie outside the curve, for example at operating point 274. Vectors 270 and 271 show magnetic moments that the MR stack 226 would feel if it were instead positioned to receive the magnetic fields having the moments indicated by arrows B1 and B5, where vector 270 corresponds to moment B1 and vector 271 corresponds to moment B5. The resultant of vectors 270 and 271 lies at operating point 274, so two magnetic fields represented by vectors 270 and 271 would be sufficient to switch the magnetic direction of the free layer of the MR stack 226. However, the vectors 270 and 271 do not reflect the arrangement shown in FIG. 9. Instead, because of the angular offset of moments B2 and B3, the vector 276 would be representative of the magnetic field from the conductive line 250. Based on vector addition, it can thus be seen that the same operating point 274 can be achieved using vector 277 instead of vector 271. Since the vector 271 has a lower magnitude than vector 277, it will be appreciated that the same operating point 274 can thus be achieved using a reduced electrical current through the conductive line 261.

It will be appreciated that still further embodiments exist and will become apparent, especially to those skilled in the art, based upon the present disclosure. For example, the staggered arrangement shown in FIG. 7 could be used to stagger MR stacks in a column direction as shown in FIG. 6. The staggered arrangement shown in FIG. 7 can be repeated such that a plurality of MR stacks are aligned along each of the A-A, B-B, and C-C axes. Also, any number of axes can be added to expand the staggered arrangement.

In addition, various staggered arrangements, such as those shown in FIGS. 5-7, can be combined in a single MRAM array. It is also contemplated that the degree of staggering can vary in a single array (i.e., the distances i and j can vary in a single array). Also, while the present disclosure is present within the context of magnetic memory devices having MR stacks, it can equally be applied to other types of magnetic memory devices; indeed, the present disclosure can be applicable to any type of device, including devices where component density and/or crosstalk are issues.

While various embodiments in accordance with the principles disclosed herein have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A magnetic random access memory array comprising:
    a staggered first conductor extending along alternating first and second parallel axes in a first direction;
    a plurality of straight second conductors extending parallel to each other along a second direction orthogonal to the first direction; and
    a first magnetoresistive stack and a second magnetoresistive stack coupled to the staggered first conductor, wherein the first magnetoresistive stack is aligned on the first parallel axis and the second magnetoresistive stack is aligned on the second parallel axis;
    a third magnetoresistive stack coupled to the staggered first conductor on the first parallel axis and thereby aligned with the first magnetoresistive stack, the second magnetoresistive stack staggered with respect to the first and third magnetoresistive stacks in the second direction; and wherein at least a portion of at least one of the first, second, or third magnetoresistive stacks is positioned between a corresponding one of the second conductors and an inflected region of the staggered first conductor.

2. A magnetic random access memory array according to claim 1, wherein the first and second magnetoresistive stacks, and the second and third magnetoresistive stacks, are separated in the first direction by a first distance i and are separated in the second direction by a second distance j.

3. A magnetic random access memory array according to claim 2, wherein the first distance i is equal to half the second distance j.

4. A magnetic random access memory array according to claim 2, wherein the second distance j is equal to half the first distance i.

5. A magnetic random access memory array according to claim 1, each of the first, second and third magnetoresistive stacks are positioned between corresponding ones of the second conductors and an inflected region of the staggered first conductor.

6. A magnetic random access memory array according to claim 5, wherein the corresponding ones of the second conductors are spaced substantially equally apart.

7. A magnetic random access memory array comprising:
a staggered first conductor extending along alternating first, second and third parallel axes in a first direction;
a plurality of straight second conductors extending parallel to each other along a second direction orthogonal to the first direction; and
a first magnetoresistive stack, a second magnetoresistive stack, and a third magnetoresistive stack each coupled to the staggered first conductor, wherein the first magnetoresistive stack is aligned on the first parallel axis, the second magnetoresistive stack is aligned on the second parallel axis, and the third magnetoresistive stack is aligned on the third parallel axis; a fourth magnetoresistive stack coupled to the staggered first conductor on the second parallel axis and thereby aligned with the second magnetoresistive stack, the first and third magnetoresistive stacks staggered with respect to the second and fourth magnetoresistive stacks in the second direction; and
wherein at least a portion of at least one of the first, second, third, or fourth magnetoresistive stacks is positioned between a corresponding one of the second conductors and an inflected region of the staggered first conductor.

8. A magnetic random access memory array according to claim 7, wherein the first and second magnetoresistive stacks, and the second and third magnetoresistive stacks, are separated in the first direction by a first distance i and are separated in the second direction by a second distance j.

9. A magnetic random access memory array according to claim 8, wherein the first distance i is equal to half the second distance j.

10. A magnetic random access memory array according to claim 8, wherein the second distance j is equal to half the first distance i.

11. A magnetic random access memory array according to claim 7, wherein at least a portion of each of the first, second, third and fourth magnetoresistive stacks are positioned between corresponding ones of the second conductors and an inflected region of the staggered first conductor.

12. A magnetic random access memory array according to claim 11, wherein the corresponding ones of the second conductors are spaced substantially equally apart.

13. A magnetic random access memory array according to claim 7, wherein the third and fourth magnetoresistive stacks are separated in the first direction by a first distance i and are separated in the second direction by a second distance j.

14. A magnetic random access memory array comprising:
a staggered first conductor extending along alternating first, second and third parallel axes in a first direction;
a plurality of straight second conductors extending parallel to each other along a second direction orthogonal to the first direction; and
a first magnetoresistive stack, a second magnetoresistive stack, and a third magnetoresistive stack each coupled to the staggered first conductor, wherein the first magnetoresistive stack is aligned on the first parallel axis, the second magnetoresistive stack is aligned on the second parallel axis, and the third magnetoresistive stack is aligned on the third parallel axis; a fourth magnetoresistive stack coupled to the staggered first conductor on the second parallel axis and thereby aligned with the second magnetoresistive stack, the first and third magnetoresistive stacks staggered with respect to the second and fourth magnetoresistive stacks in the second direction
a fifth magnetoresistive stack coupled to the staggered first conductor on the first parallel axis and thereby aligned with the first magnetoresistive stack, the second, third and fourth magnetoresistive stacks staggered with respect to the first and fifth magnetoresistive stacks in the second direction; and
wherein at least a portion of at least one of the first, second, third, fourth, or fifth magnetoresistive stacks is positioned between a corresponding one of the second conductors and an inflected region of the staggered first conductor.

15. A magnetic random access memory array according to claim 14, wherein the first and second magnetoresistive stacks, and the second and third magnetoresistive stacks, are separated in the first direction by a first distance i and are separated in the second direction by a second distance j.

16. A magnetic random access memory array according to claim 15, wherein the first distance i is equal to half the second distance j.

17. A magnetic random access memory array according to claim 15, wherein the second distance j is equal to half the first distance i.

18. A magnetic random access memory array according to claim 14, wherein at least a portion of each of the first, second, third, fourth and fifth magnetoresistive stacks are positioned between corresponding ones of the second conductors and an inflected region of the staggered first conductor.

19. A magnetic random access memory array according to claim 18, wherein the corresponding ones of the second conductors are spaced substantially equally apart.

20. A magnetic random access memory array according to claim 14, wherein the third and fourth magnetoresistive stacks, and the fourth and fifth magnetoresistive stacks, are separated in the first direction by a first distance i and are separated in the second direction by a second distance j.

* * * * *

UNITED STATES PATENT AND TRADEMARK OFFICE
CERTIFICATE OF CORRECTION

PATENT NO. : 7,349,234 B2  Page 1 of 1
APPLICATION NO. : 11/119052
DATED : March 25, 2008
INVENTOR(S) : Peng et al.

It is certified that error appears in the above-identified patent and that said Letters Patent is hereby corrected as shown below:

Column 9, Line 17, Claim 5, insert -- wherein -- after "claim 1,"

Signed and Sealed this

First Day of July, 2008

JON W. DUDAS
*Director of the United States Patent and Trademark Office*

UNITED STATES PATENT AND TRADEMARK OFFICE
CERTIFICATE OF CORRECTION

PATENT NO.         : 7,349,234 B2
APPLICATION NO.    : 11/119052
DATED              : March 25, 2008
INVENTOR(S)        : Peng et al.

Page 1 of 1

It is certified that error appears in the above-identified patent and that said Letters Patent is hereby corrected as shown below:

Column 9, Line 17, Claim 5, insert -- wherein -- after "claim 1,"

Signed and Sealed this

Eighth Day of July, 2008

JON W. DUDAS
*Director of the United States Patent and Trademark Office*